(12) United States Patent
Barakat et al.

(10) Patent No.: US 9,032,274 B2
(45) Date of Patent: May 12, 2015

(54) METHOD AND APPARATUS FOR CLOCK AND DATA RECOVERY

(71) Applicant: Advanced Micro Devices, Inc., Sunnyvale, CA (US)

(72) Inventors: Shadi M. Barakat, Foster City, CA (US); Bhuvanachandran K. Nair, Fremont, CA (US); Paul-Hugo Lamarche, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 177 days.

(21) Appl. No.: 13/898,806

(22) Filed: May 21, 2013

(65) Prior Publication Data

US 2014/0229785 A1  Aug. 14, 2014

Related U.S. Application Data

(60) Provisional application No. 61/764,617, filed on Feb. 14, 2013.

(51) Int. Cl.
*H03M 13/00* (2006.01)
*G01R 31/28* (2006.01)
(Continued)

(52) U.S. Cl.
CPC ...... *H04L 1/12* (2013.01); *H04L 1/243* (2013.01); *H04L 7/033* (2013.01); *H04L 7/10* (2013.01);
(Continued)

(58) Field of Classification Search
CPC ..... H04L 7/033; H04L 7/0025; H04L 7/0337; H04L 7/0031; H04L 7/04; H04L 1/12; H04L 1/243; H04L 7/0041; H04L 7/02; H04L 7/10; H03L 7/0814; H03L 7/07; H03L 7/06; H03L 7/0998; H03L 7/197; G11C 2211/4061; G11C 29/022; G11C 29/023; G11C 29/028; G11C 7/22; G11C 7/222
USPC .......... 714/775, 731, 704, 746; 375/376, 358, 375/327, 254, 240.04, 240.05, 240.06, 375/240.07, 226, 227
See application file for complete search history.

(56) References Cited

U.S. PATENT DOCUMENTS 5,838,749 A * 11/1998 Casper et al. ................. 375/376
7,512,201 B2 * 3/2009 Kelly et al. ................... 375/356
(Continued)

OTHER PUBLICATIONS

Bae et al., An MLSE Receiver for Electronic Dispersion Compensation of OC-192 Fiber Links, Nov. 2006, IEEE, vol. 41, No. 11, pp. 2541-2554.*
(Continued)

*Primary Examiner* — John J Tabone, Jr.

(57) ABSTRACT

A multi-link input/output (I/O) interface uses both feed-forward and feedback signaling to reduce the impact of noise on data capture at a memory controller. To transfer data from a source module to a destination module, a defined pattern is communicated from the memory module along a master channel concurrent with the memory module providing data via one or more slave channels. Based on the phase of the defined pattern as it is received, the multi-link I/O interface feeds forward to the slave channels control signaling whose phase reflects a predicted noise pattern for the system. Each slave channel performs CDR by adjusting timing of its corresponding capture clock signal based on the fed forward control signaling and based on feedback signaling for the corresponding slave channel, whereby the feedback signaling reflects an error measurement between a phase of a capture clock signal and transitions in received data.

20 Claims, 6 Drawing Sheets

(51) Int. Cl.

| | | |
|---|---|---|
| *G06F 11/00* | (2006.01) | |
| *H04L 7/00* | (2006.01) | |
| *H04L 1/12* | (2006.01) | |
| *H04L 1/24* | (2006.01) | |
| *H04L 25/14* | (2006.01) | |
| *G11C 29/02* | (2006.01) | |
| *H04L 7/033* | (2006.01) | |
| *H04L 7/10* | (2006.01) | |

(52) U.S. Cl.
CPC ........ *H04L 25/14* (2013.01); *G11C 2211/4061* (2013.01); *G11C 29/022* (2013.01); *G11C 29/023* (2013.01); *G11C 29/028* (2013.01)

(56) References Cited

U.S. PATENT DOCUMENTS

| | | | | |
|---|---|---|---|---|
| 7,702,058 | B2* | 4/2010 | Margules | 375/376 |
| 7,817,767 | B2* | 10/2010 | Tell et al. | 375/376 |
| 2003/0212930 | A1* | 11/2003 | Aung et al. | 714/700 |
| 2004/0170244 | A1* | 9/2004 | Cranford et al. | 375/373 |
| 2004/0212416 | A1* | 10/2004 | Buchwald et al. | 327/248 |
| 2005/0105662 | A1* | 5/2005 | Margules | 375/376 |
| 2006/0140321 | A1* | 6/2006 | Tell et al. | 375/376 |

OTHER PUBLICATIONS

Kendall Castor-Perry, Programmable Clock Generation and Synchronization for USB Audio Systems, 2011, The Ins and Outs of Audio—AES 24 th UK Conference 2011, pp. 1-10.*

\* cited by examiner

METHOD AND APPARATUS FOR CLOCK AND DATA RECOVERY

FIELD OF THE DISCLOSURE

The present disclosure relates generally to clock and data recovery and more particularly to clock and data recovery for multi-link input/output interface systems.

BACKGROUND

Some processing systems employ a multi-link input/output (I/O) interface to transfer data between system modules. For example, a processing system can include a memory subsystem that uses a multilink I/O interface to transfer data from a memory module to a memory controller. Typically, the multi-link I/O interface transfers the data between a source module and a destination module without an accompanying clock signal. The multi-link I/O interface therefore employs clock and data recovery (CDR) techniques to generate a clock signal for capturing the provided data. However, noise on the links (channels) of the interface can change the phase of the received data, potentially resulting in errors in the captured data.

Such errors can be reduced by periodically training the multi-link I/O interface, whereby defined training signals are transmitted along the links (also referred to as channels) and the multi-link I/O interface adjusts the phase of the capture clock signal until a defined pattern is accurately captured. However, the training requires additional hardware, increasing the size of the multi-link I/O interface, and interrupts processing of data transfer transactions, reducing system throughput. In addition, the defined training signals typically are based on predicted noise patterns that may differ from the noise experienced by the multi-link I/O interface, reducing the effectiveness of the training process. Instead of using training signals, the multi-link I/O interface can adjust the phase of the capture clock signal based on transitions (edges) in the data being transferred. However, the data may not include enough transitions in order to accurately phase align the capture clock signal with transitions in the data, resulting in data capture errors.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
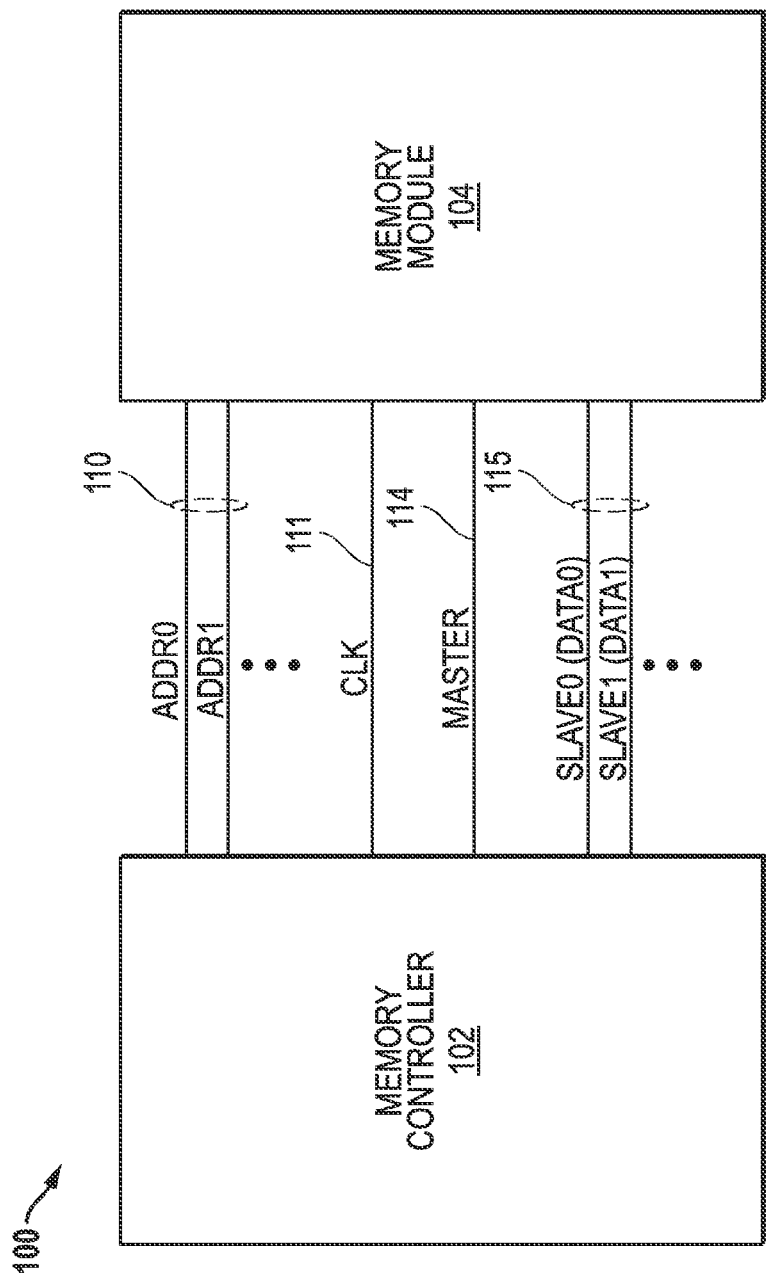
FIG. 1 is a block diagram of a memory subsystem of a processor in accordance with some embodiments.

FIGS. 1-8 illustrate example techniques for performing clock and data recovery (CDR) at a multi-link I/O interface using both feed-forward and feedback signaling to reduce the impact of noise on data capture. The multi-link I/O interface uses a master channel and a set of slave channels, whereby the slave channels transfer data from a source module (e.g. a memory module) to a destination device (e.g. a memory controller). Each slave channel employs a feedback arrangement to phase align its corresponding data signal with a capture clock signal. The feedback arrangement relies on transitions in the data received via a data signal to perform phase alignment and the received data thus may not have a sufficient number of edges to ensure accurate phase alignment and therefore accurate data capture. Accordingly, the multi-link I/O interface employs feed-forward information from the master channel to assist each of the slave channels in phase aligning the capture clock signal with the slave channels respective data signals. Thus, the feed-forward information acts as a coarser control on the phase alignment by controlling it within a defined range, while the feedback arrangements at the slave channels acts as a finer control on the phase alignment by trimming the phase alignment based on any noise present at each slave channel. The combination of feed-forward control and feedback trim provides for more accurate phase alignment of the capture clock signal with the received data signals, thereby ensuring more accurate data capture.

To illustrate, in the multi-link I/O interface the source module retrieves requested data for the destination module based on a clock signal provided by the destination module. However, the source module provides the data to the destination module without an accompanying clock signal. Further, because of clock insertion delay, noise, and other factors the timing of transitions in the data signal representing provided data is indeterminate with respect to the memory controller clock. Accordingly, in order to accurately transfer the data, the multi-link I/O interface must phase align the capture clock signal (the clock signal that causes data to be latched or otherwise captured at the memory controller) for each slave channel with transitions in the data signal.

To generate the capture clock signal for each slave channel, the multi-link I/O interface uses feedback information for the corresponding slave channel and feed-forward information from a master channel. The feedback information indicates a difference in phase between the received data signal and the capture clock signal. However, the phase difference typically is measured based on the differences between transitions in the data signal and transitions in the capture clock signal and the data signal may not have a sufficient number of transitions to ensure proper phase alignment. For example, the data signal may provide a relatively long series of bits having a value "1", such that the data signal does not experience a transition for a long period of time. Accordingly, the feed-forward signal provides additional phase alignment information for the capture clock of each slave channel.

In particular, the master channel includes a feedback loop, similar to those of the slave channels, to phase align its own capture clock signal to received data. For each data transfer, the source module provides a test pattern via the master channel, whereby the test pattern includes a defined number of transitions. The number of transitions is sufficiently high to allow the feedback signals at the master channel to accurately phase align the test pattern with the master channel's capture clock signal. In addition, the master channel feeds forward its feedback information to the slave channels to assist in phase aligning the capture clock signal at each phase channel.

The feed-forward information alone typically is not sufficient to accurately phase align the slave channels' capture clock signals with their corresponding received data due to variance between noise at the slave channels and noise at the master channel causing different phase changes at each channel. Accordingly, the feed-forward information provides sufficient adjustment information to allow each slave channel to phase align its received data signal with its capture clock signal within a certain tolerance, and the feedback information at each slave channel trims the phase alignment to improve alignment accuracy, thereby improving the accuracy of the data capture.

In some embodiments, the feed-forward information is provided from the master channel to the slave channels via a filter, whereby the filter coefficients represent a predicted noise profile for the memory subsystem. In particular, the predicted noise profile for the memory subsystem can be characterized via series of tests of the noise system, and the filter coefficients adjusted to address the noise profile.

For purposes of description, a multi-link I/O interface is described in the example context of a memory subsystem of a processing system, whereby the multi-link I/O interface is distributed among a memory module (the source module) and a memory controller (the destination module) of the memory subsystem. However, it will be appreciated that the techniques described herein can be employed in other multi-link I/O interfaces, such as a graphics processing subsystem of a processing system.

FIG. 1 illustrates a memory subsystem 100 in accordance with some embodiments. The memory subsystem 100 is a portion of processing system that includes a processor (not shown) and is generally configured to execute memory transactions, such as load requests and store requests, in response to requests from the processor. Accordingly, the memory subsystem can be a portion of any of a number of electronic devices, such as a computer, tablet, cell phone, television, media player, game system, or any other electronic device that employs a processor and memory.

To execute memory transactions, the memory subsystem 100 includes a memory controller 102 and a memory module 104. The memory controller 102 is configured to receive load and store requests from a processor and, in response, provide control signaling to the memory module 104 to satisfy the requests. The memory module 104 includes a set of bit cells (not shown) that are each able to store an individual bit of information. In response to control signaling from the memory controller 102 the memory module 104 either stores data at the bit cells (if the control signaling represents a store request) or provides data stored at the bit cells to the memory controller 102 (if the control signaling represents a load request). The memory module 104 can comprise, for example, a cache or system memory.

For purposes of illustration, the operation of the memory controller 102 and the memory module 104 will be described in the context of a load request. The memory controller 102 initiates the transfer of data in response to the load request by providing a memory address associated with the load request via address lines 110. In addition, the memory controller 102 provides a clock signal, labeled "CLK" via a clock line 111 to provide timing information for the data transfer.

In response to receiving the address and the CLK signal, the memory module 104 retrieves the data from the bit cells identified by the address and uses the clock signal to synchronize provision of the data via data signals transmitted along slave channels 115. However, because of noise on the clock line 111 and the slave data channels 115, clock insertion delay, and other factors, the transmitted data may not be synchronized with the CLK signal. That is, the particular point in time at which a data signal provided via one of the slave channels 115 correctly represents the data stored at the associated bit cell can vary relative to transitions in the CLK signal provided via the clock line 111. Accordingly, the memory controller 102 performs clock and data recovery (CDR) on the data signals received via the stave channels 115 to phase align those data signals with the capture clock signal for each slave channel, thereby establishing the point in time at which the data signals are defined as representing the stored data.

To facilitate CDR, the memory module 104 provides a defined test pattern to the memory controller 102 via a master channel 114 in response to receiving the clock signal and address for the load request. The memory controller 102 generates capture clock signals for each of the slave channels 115 based on teed-forward noise adjustment information based on a predicted noise pattern, whereby the feed-forward noise adjustment information is fed forward from the master channel to each of the slave channels; and based on feedback information for each slave channel to account for noise present on each slave channel. The memory controller 102 thereby accounts both for the predicted noise pattern and the actual noise present at each slave channel while also providing enough granularity in the timing signals to provide proper phase alignment for the received data.

Figure 2:
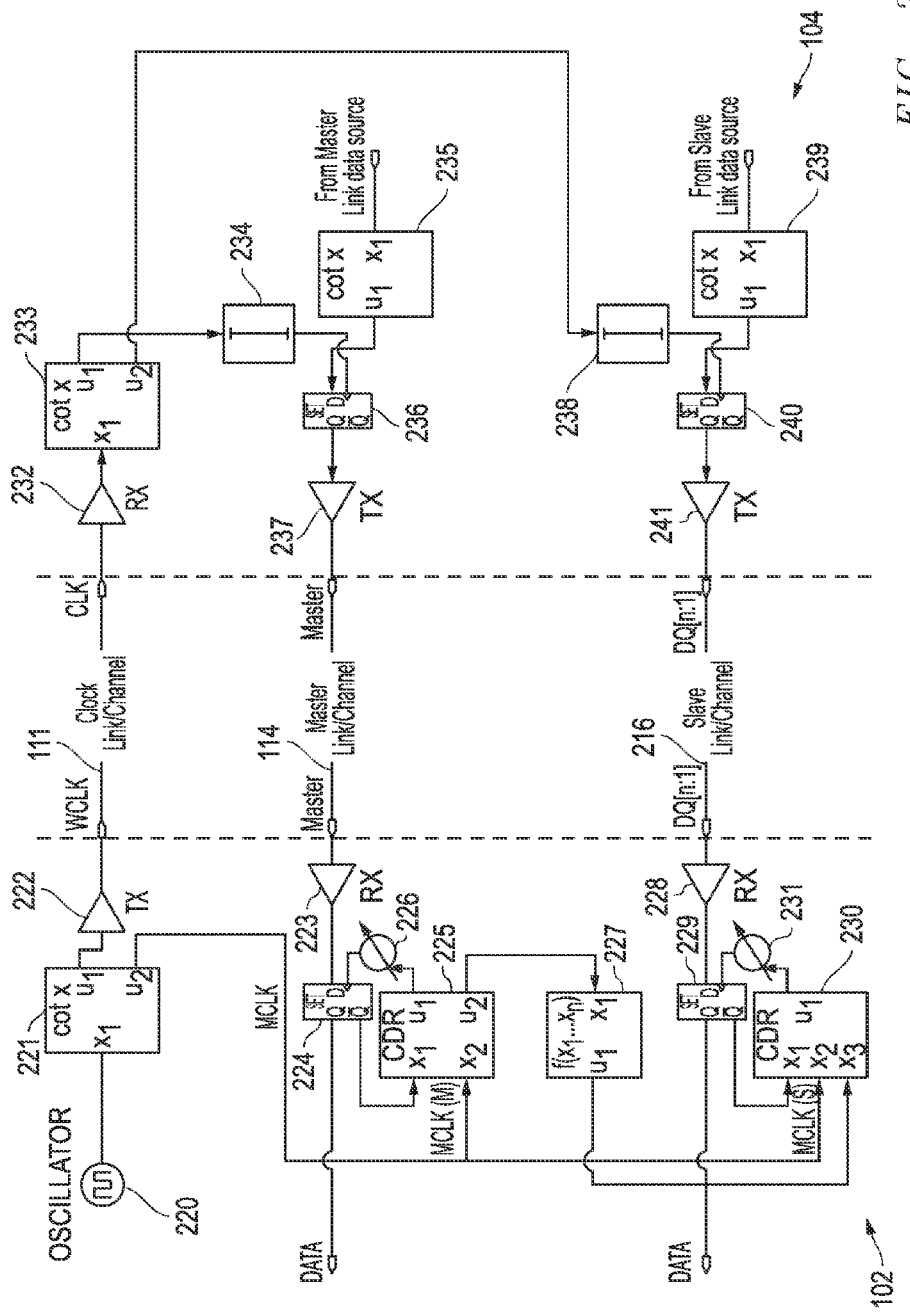
FIG. 2 is a block diagram illustrating master and slave channels of the memory subsystem of FIG. 1 in accordance with some embodiments.

FIG. 2 illustrates components of the memory controller 102 and memory module 104 involved in dock and data recovery in accordance with some embodiments. The memory controller 102 includes an oscillator 220, a clock generator 221, a signal driver 222, signal receivers 223 and 228, decision devices 224 and 229, CDR modules 225 and 230, and feedback modules 226 and 231. The oscillator 220 includes an output to provide an oscillating signal. The clock generator 221 includes an input connected to the output of the oscillator 220 a first output to provide the CLK signal, and a second output to provide a clock signal labeled "MCLK." The signal driver 222 includes an input to receive the CLK signal and an output to provide the CLK signal.

The signal receiver 223 includes an input connected to the master channel 114 and an output. The decision device 224 includes a data input connected to the output of the driver 223, a clock input to receive a capture clock signal, a first data output to provide data to a register or other storage location (not shown) of the memory controller 102, and a second data output. The CDR module 225 includes an input connected to the second output of the decision device 224, an input to receive the MCLK signal, a first output and a second output. The feedback module 226 includes an input connected to the first output of the CDR module 225 and an output to provide the capture clock signal to the clock input of the decision device 224.

The feed-forward filter 227 includes an input connected to the second output of the CDR module 225 and an output. The CDR module 230 includes a first input connected to the output of the feed-forward filter 227, a second input to receive the clock signal MCLK, a third input and an output. The signal receiver 228 includes an input connected to the stave channel 216 and an output. The decision device 229 includes a data input connected to the output of the driver 228, a clock input to receive a capture clock signal, and an output to provide data for the slave channel 216. The feedback module 231 includes an input connected to the output of the CDR module 230 and an output to provide the capture clock signal to the clock input of the decision device 229. It will be appreciated that for clarity of description only a single slave channel 216 of the slave channels 115 (FIG. 1) is illustrated, but that each of the slave channels 115 has a similar configuration of CDR module, feedback module, and decision device connected similarly to the output of the filter 227.

The memory module 104 includes a signal receiver 232, signal drivers 237 and 241, a dock filter 233, data processors 235 and 239, and decision devices 236 and 240. In addition, FIG. 2 illustrates clock insertion delays 234 and 238, representing the respective delays introduced in a clock signal by the signal path between the clock filter 233 and the decision device 236 and between the clock filter 233 and the decision device 240.

The receiver 232 includes an input connected to the clock line 111 and an output. The clock filter 233 includes an input connected to the output of the receiver 232, a first output, and a second output. The data processor 235 includes an input connected to a set of master channel bit cells (not shown) and an output. The decision device 236 includes a data input connected to the output of the data processor 235, a clock input connected to the first output of the clock filter 233, and an output. The driver 237 includes an input connected to the output of the decision device 236 and an output connected to the master channel 114. The data processor 239 includes an input connected to a set of slave channel bit cells (not shown) and an output. The decision device 240 includes a data input connected to the output of the data processor 239, a clock input connected to the second output of the clock filter 233, and an output. The driver 241 includes an input connected to the output of the decision device 240 and an output connected to the slave channel 216.

The drivers 222, 237, and 241 are each configured to drive their respective input signals to their output signals with a higher current, but with negligible impact on the timing of the input signals. The signal receivers 223, 228, and 232 are configured to amplify and filter their received input signals so that the output signals are conditioned for their connected decision devices. Each of the decision devices 224, 229, 236, and 240 is a clock-trigger decision device that, in response to defined edges of the device's corresponding capture clock signal, determines whether the signal at its input represents a digital value of 1 or zero. The decision devices 224, 229, 236, and 240 can be latches, latching comparators, and the like, or a combination thereof.

The oscillator 220 is configured to generate a stable periodic signal at a defined frequency to effectuate a transfer of data from the memory module 104. The clock generator 221 generates the CLK and MCLK signals based on the output of the oscillator 220. In some embodiments, the CLK and MCLK have substantially the same frequency and phase.

The clock filter 233 is configured to filter high frequency noise added to the CLK signal as it is transmitted along the clock line 111. Accordingly, the outputs of the clock filter 233 provide clock signals having substantially the same frequency and phase as the CLK signal. However, the clock insertion delays 234 and 238 cause perturbations in the clock signals, such that the capture clock signals received at the clock inputs of the decision devices 236 and 240 are in an indeterminate phase relationship with the CLK and MCLK signals.

The data processors 235 and 239 each process data stored at their associated bit cells and provide a digital output indicating whether the corresponding bit cell stores a digital value of "1" or "zero". The decision devices 236 and 240 provide a digital output based on the output signals of the data processors 235 and 239, respectively, in response to edge of the capture clock signals received at their respective inputs.

At the memory controller 102, the decision device 224 is configured to provide a digital output representing data provided via the master channel 114 in response to edges of the capture clock signal received at its clock input. The CDR module 225, the feedback module 226, and the decision device 224 are a feedback arrangement to phase align transitions in the data provided via the master channel 114 with the capture clock signal of the decision device 224. This causes the decision device 224 to determine its digital output when the received data signal is in a stable, rather than transitioning, state such that the received data is captured accurately. In particular, the CDR module 225 is generally configured to measure the phase difference between transitions in the received data (as indicated by the second output of the decision device 224) and the clock signal MCLK. Based on this phase difference, the CDR module generates a clock signal and provides it to the feedback module 226. The feedback module 226 adjusts the received clock signal according to stored trim data (not shown) to generate the capture clock signal for the decision device 224. In some embodiments, the trim data is generated and stored during a test phase for the memory subsystem 100, whereby defined test signals are transmitted along the master channel 114 and each of the slave channels 115 and the trim data is adjusted until the defined test signals are accurately captured at each channel. The trim data thereby accounts for variations in the performance of, for example, the CDR module 225 due to process variations.

The decision device 229, CDR module 230 and feedback module 231 are a feedback arrangement in a similar feedback configuration as the corresponding modules for the master channel 114, providing for capturing of data at the slave channel 216. However, because the data received via the slave link channel does not have a guaranteed number of edges, the feedback arrangement alone cannot accurately phase align transitions in the received data with the capture clock signal of the decision device 229. Accordingly, the memory controller 102 includes a feed-forward arrangement, whereby clock adjustment information is fed forward from the CDR module 225 via the feed-forward filter 227. In some embodiments, the feed-forward filter 227 filters the output of the CDR module 225 according to a predicted noise pattern for the slave channel 216. To illustrate, during a training phase tier the memory subsystem 100, a set of test signals are transmitted via the master channel 114 and the slave channels 115. The feed-forward filter 227 includes a set of programmable coefficients that determine filter behavior. During the training phase, the coefficients are programmed to adjust the fed-forward information such that the capture clock signals for each of the slave channels 115 are phase aligned with their received test signals. The feed-forward filter 227 thus addresses a predicted noise pattern for the slave channels 115.

For example, in some embodiments, noise at a particular frequency is present, during the training phase, on the master channel 114. The noise is reflected in the feedback signal from the decision device 224 to the CDR module, and can therefore cause erroneous frequency components to be present in the feed-forward signal provided to the feed-forward filter 227. Absent filtering, these erroneous frequency components would potentially result in misalignment of the phases of the capture clock signals and the data received at each of the slave channels 115. Accordingly, during the training phase, the coefficients of the feed-forward filter 227 are adjusted to filter out these erroneous frequency components. Because the noise experienced during the training phase may not match the actual noise present on the slave channels 115, the noise filtered by the fed-forward filter 227 represents a predicted noise profile for the memory subsystem 100 as identified during the training phase. Thus, the feed-forward signal, as provided by the feed-forward filter 227 represents capture clock adjustment information based on a predicted noise profile for the memory subsystem 100.

The CDR module 230 combines the output signal of the feed-forward filter 227, the output of the decision device 229 (the feedback signal), and the MCLK signal to generate the capture clock signal for the decision device 229. The generated clock signal phase aligns the data received via the slave channel 216 so that the data is captured accurately by the decision device 229. The feedback signal varies according to any noise actually present at the slave channel 216. Accordingly, the CDR module 230 adjusts the capture clock signal based both on the predicted noise profile for the memory subsystem 100, as reflected in the feed-forward signal from the feed-forward filter 227, and on the actual noise present at the slave channel 216, as reflected in the feedback signal. The combination of the feed-forward and feedback information provides for more accurate phase-alignment of the capture clock signal at each of the slave channels 115, and therefore provides for more accurate data capture.

In operation, the memory controller 102 initiates a transfer of data from the memory module 104 by providing an address and a defined number of edges of the clock signal CLK to the memory module 104. In response, the memory module 104 retrieves the data from the bit cells corresponding to the address and provides the data via the slave channels 115. Accordingly, at least a single bit of the data is identified at the decision device 240 and provided via the slave channel 216. In addition, the memory module 104 provides, via the master channel 114 a test pattern including a defined number of edges. The decision device 224, CDR module 225, and feedback module 226 use the test pattern to set the clock signal for the decision device 224 in order to phase align the edges of the test pattern to a defined relationship with the MCLK signal.

The feed-forward filter 227 filters the capture clock signal for the decision device 224 based on the predicted noise pattern and forwards the resulting signal to the CDR module 230, which combines the filtered signal with the feedback signal from the decision device 229. Based on this information and the MCLK signal, the CDR module 230 and the feedback module 231 together provide a clock signal to the decision device 229 that phase aligns the data received via the slave channel 216 with the MCLK signal on that data can be accurately captured at the decision device 229. The feed-forward information provided by the feed-forward filter 227 ensures that the CDR module 230 has enough information to accurately phase align the clock signal for the decision device 229, while the feedback information provided via the output of the decision device 229 accounts for the particular noise added by the transmission of data via the stave channel 216. The combination of feed-forward and feedback information provides for more accurate data capture from the memory module 104.

In some embodiments, the memory controller 102 can improve the accuracy of the capture clock phase alignment by periodically training the feedback arrangement for each slave channel. In particular, the memory controller 102 can identify intervals when data is not to be sent along the slave channels 115 for this training. For example, the memory controller 102 can determine that no load requests are likely to be received for a threshold amount of time, such that no data will be transmitted via the slave channels 115. In response, the memory controller 102 can instruct the memory module 104 to send a defined training signal via each of the slave channels 115, whereby the defined training signal has a defined number of transitions. The CDR modules at each of the slave channels 115 use the transitions to adjust their feedback signals, thereby improving the phase alignment of the capture clock signals at each slave channel. Because the training signals are transmitted when the slave channels 115 are not being used to communicate data, accuracy and speed of the phase alignment is improved without impacting throughput at the memory subsystem 100.

Figure 3:
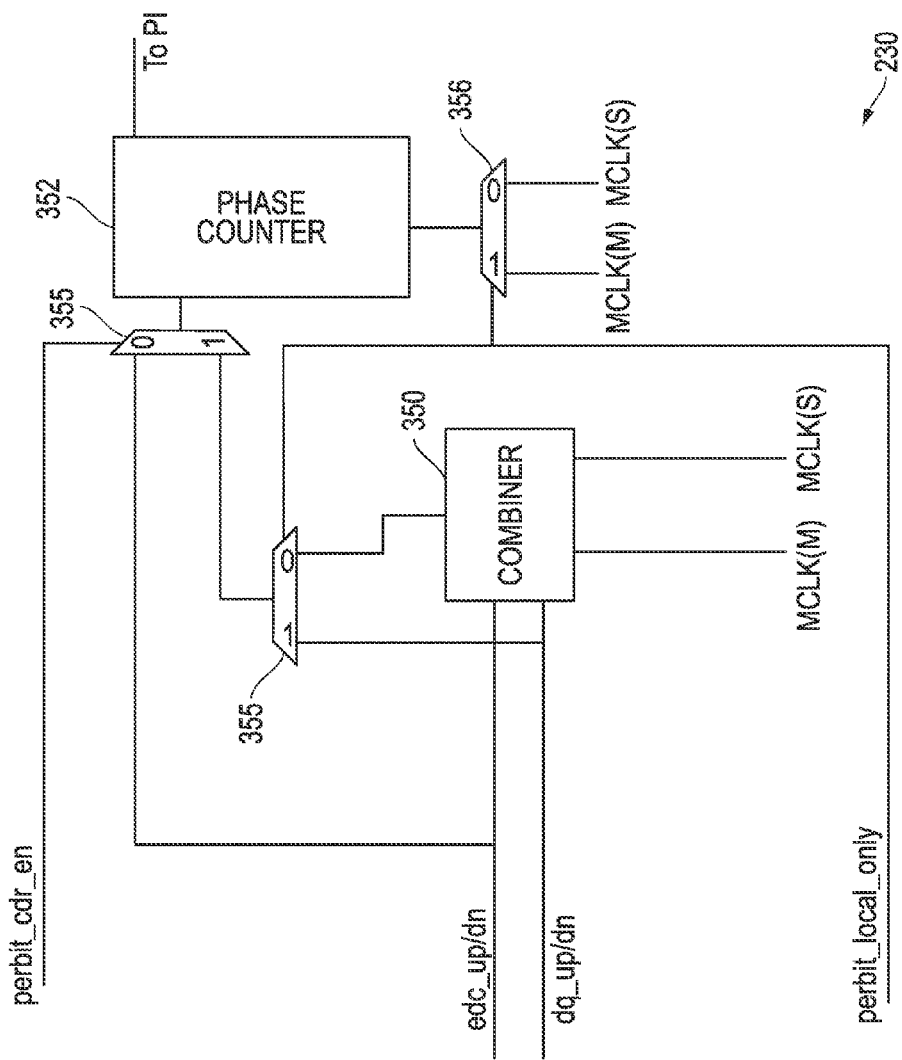
FIG. 3 is a block diagram of a clock-and-data recovery module of a slave channel of FIG. 2 in accordance with some embodiments.

FIG. 3 illustrates a block diagram of the CDR module 230 in accordance with some embodiments. The CDR module 230 includes a combiner 350, a phase counter 352, and bit selectors 354, 355, and 356. The combiner 350 includes an input to receive the feed-forward signal from the feed-forward filter 227, an input to receive the feedback signal from the decision device 229, an input to receive the MCLK signal from the master channel domain, an input to receive the MCLK signal from the slave channel domain, and the output. Note that in FIG. 3 the MCLK signals are illustrated as separate signals for the master and slave channel domains, to account for clock insertion delay or other perturbations that cause the MCLK signal to have a different phase in each domain.

The bit selector 355 includes an input to receive the feedback signal from the decision device 229, an input connected to the output of the combiner 350, a control input to receive a control signal labeled "perbit_local_only" and an output. The bit selector 354 includes an input connected to the output of the hit selector 355, an input to receive the feed-forward signal from the feed-forward filter 227, a control input to receive a control signal labeled "perbit_cdr_en" and an output. The bit selector 356 includes an input to receive the MCLK signal from the master channel domain, an input to receive the MLCK signal from the slave clock domain, and an output. The phase counter 352 includes an input connected to the output of the hit selector 354, an input connected to the output of the bit selector 356, and an output.

The phase counter 352 is configured to store an adjustable value and to output a periodic signal whose phase is dependent on the adjustable value. The adjustable value is adjusted in response to signals at the inputs of the phase counter 352. The control signals "perbit_cdr_en" and "perbit_local_only" are mode control signals that determine which of the feedback and feed-forward signals determine adjustment of the adjustable value at the phase counter 352. Thus, these mode control signals determine whether the phase of the clock signal for the slave channel decision device 229 are controlled by the feed-forward signal from the feed-forward filter 227, by the feedback signal from the decision device 229, or by a combination of the feedback and feed-forward signals.

If the mode control signals are set such that the value at the phase counter 352 is adjusted based on a combination of the feedback and feed-forward signals, adjustment occurs according to the following pseudo-code, where edc_up/dn represents a state of the feed-forward signal and dq_up/dn represents a state of the feedback signal:

Sum=(up_dq+up_edc+up_save)−(dn_dq+dn_edc+dn_save);
  up_save=1 if sum>1;
  dn_save=1 if sum<−1;
  Out=up if sum>0; (increase value at phase counter if sum is greater than 0)
  Out=dn if sum<0; (decrease value at phase counter if sum is less than 0)

Accordingly, the CDR module 230 sets the phase of the clock signal 229 based on both the feed-forward signal from the master channel 114 and the feedback from the slave channel 216. The CDR module 230 thereby accounts both for the predicted noise profile as reflected in the feed-forward signal and the particular noise present on the slave channel 216, as reflected in the feedback signal.

Figure 4:
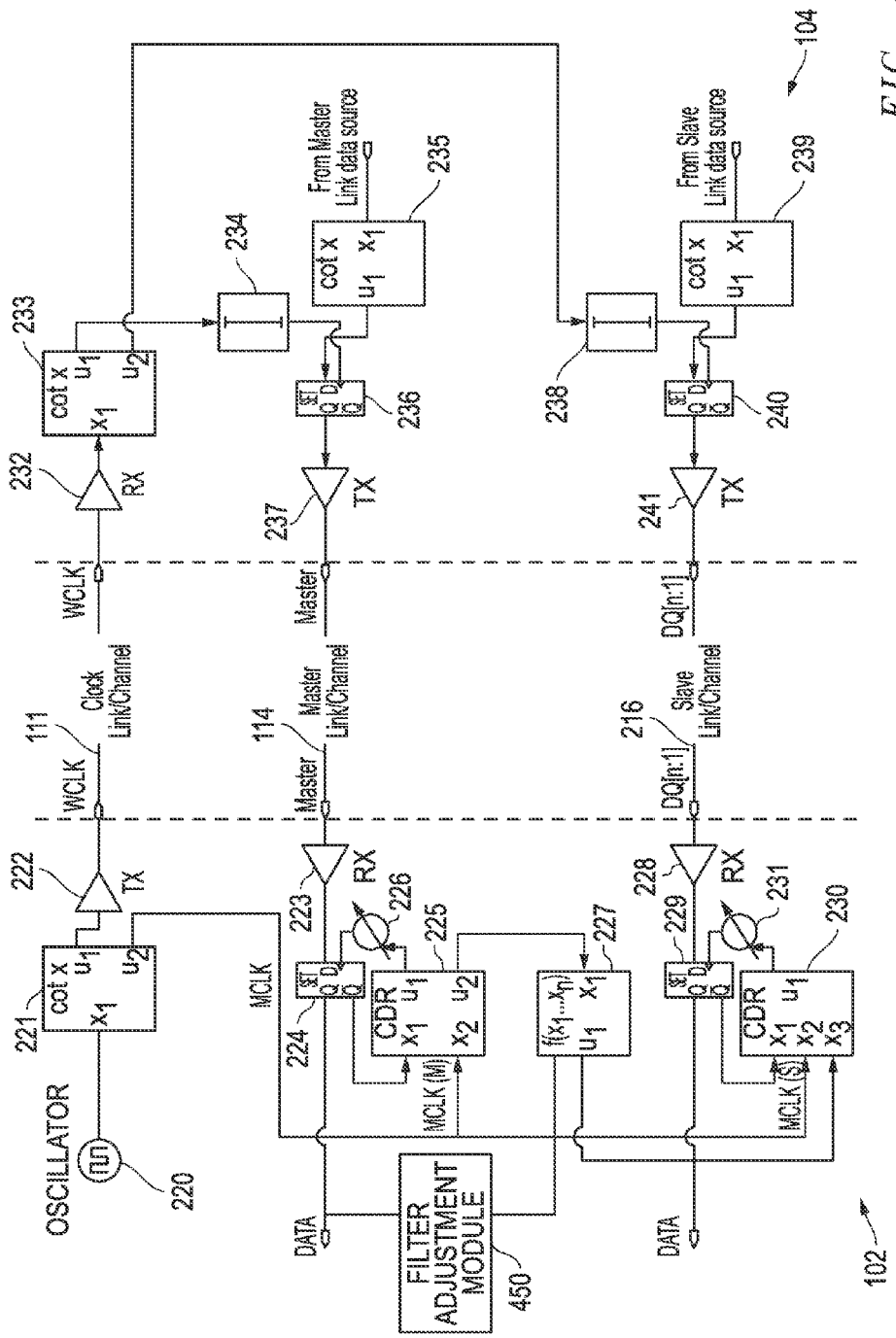
FIG. 4 is a block diagram illustrating master and slave channels of the memory subsystem of FIG. 1 including a feedback adjustment module for the master channel in accordance with some embodiments.

FIG. 4 illustrates a block diagram of components of the memory controller 102 and memory module 104 involved in clock and data recovery in accordance with some embodiments. In the illustrated example, the memory controller 102 and memory module 104 are configured similarly to the corresponding modules of FIG. 2, with the addition of a filter adjustment module 450 having an input connected to the output of the decision device 224 and an output connected to the feed-forward filter 227. In operation, during a load access the master channel 114 sends a test pattern as described above. The test pattern will be perturbed by any noise present on the master channel 114. Accordingly, the combination of the test pattern and the noise will be reflected in the output signal of the decision device 224. The filter adjustment module 450 reads this output signal and compares it to the expected test pattern, thereby measuring a noise profile for the master channel 114. Based on this measured noise profile, and reflecting the assumption that the noise profile for the master channel 114 is similar for the slave channels 115, the filter adjustment module 450 adjusts the coefficients of the feed-forward filter 227 to ameliorate the measured noise profile. Accordingly, in the illustrated example of FIG. 4, the feed-forward output signal of the feed-forward filter 227 is based on a predicted noise profile, but is adjusted to also reflect the actual noise profile measured on the master channel 114.

Figure 5:
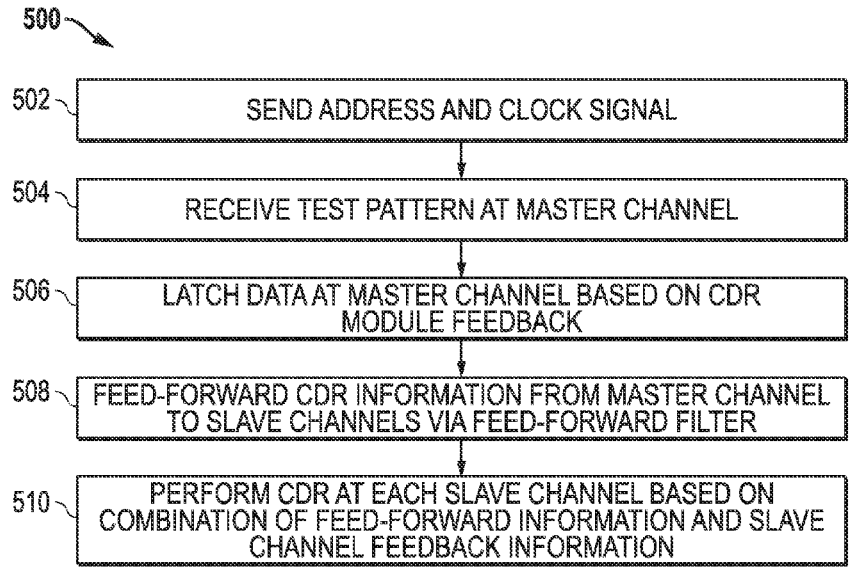
FIG. 5 is a flow diagram illustrating a method of using feed-forward and feedback signaling to address noise at a slave channel of a memory subsystem in accordance with some embodiments.

FIG. 5 illustrates a flow diagram of a method 500 of performing CDR at a memory controller in accordance with some embodiments. For purposes of illustration, the method 500 is described with respect to an example implementation of the memory controller 102 of FIGS. 1 and 2. At block 502, the memory controller 102 initiates a load access to the memory module 104 by providing an address and a clock signal via the clock line 111. In response, the memory module 104 retrieves the data from the bit cells identified by the address, and provides the test pattern via the master channel 114. The test pattern is received by the memory controller 102 at block 504. In response, at block 506 the combination of the decision device 224, CDR module 225, and feedback module 226 use the received test pattern to phase align the clock signal that triggers data capture at the decision device 224 with the clock signal MCLK and decision device the data received via the master channel based on the phase-aligned clock signal. At block 508, the CDR module 225 feeds forward CDR information, based on the received test pattern, via the feed-forward filter 227, which filters the feed-forward information according to the predicted noise profile for the master channel 114. At block 510, each of the slave channels 115 (FIG. 1) uses the filtered feed-forward information from the feed-forward filter and feedback information at the slave channel to perform CDR for the data received from the memory module 104. For example, the combination of the decision device 229, CDR module 230, and feedback module 231 use the feed-forward information from the feed-forward filter 227 and the feedback information from the feedback module 231 to phase align the capture clock signal data at the decision device 229 with transitions in the data received via the slave channel 216, thereby permitting accurate capture of the received data.

Figure 6:
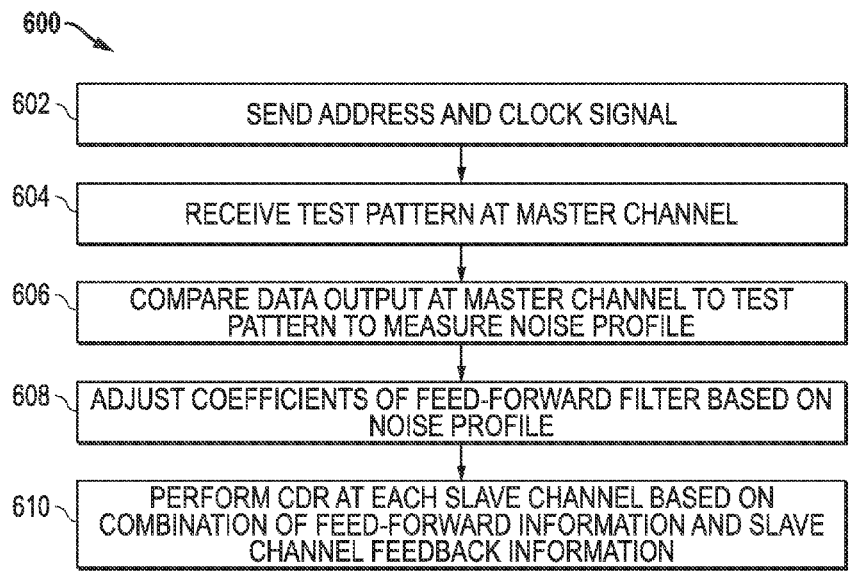
FIG. 6 is a flow diagram illustrating a method of adjusting feed-forward signaling to address noise at a slave channel of a memory subsystem in accordance with some embodiments.

FIG. 6 is a flow diagram of a method 600 of adjusting feed-forward signaling to address noise at a slave channel of a memory subsystem in accordance with some embodiments. For purposes of illustration, the method 600 is described with respect to an example implementation at the memory controller 102 of FIG. 4. At block 602, the memory controller 102 initiates a load access to the memory module 104 by providing an address and a clock signal via the clock line 111. In response, the memory module 104 retrieves the data from the bit cells identified by the address, and provides the test pattern via the master channel 114. The test pattern is received by the memory controller 102 at block 604. At block 606 the filter adjustment module 450 compares the received test pattern with the expected test pattern to measure a noise profile for the master channel 114. At block 608 the filter adjustment module 450 adjusts the coefficients of the feed-forward filter 227 to filter noise according to the measured noise profile. At block 610 the slave channels 115 each perform CDR on received data based on a combination of the feed-forward information provided by the feed-forward fitter 227, as adjusted by the filter adjustment module 450, and the feedback information for each slave channel.

Figure 7:
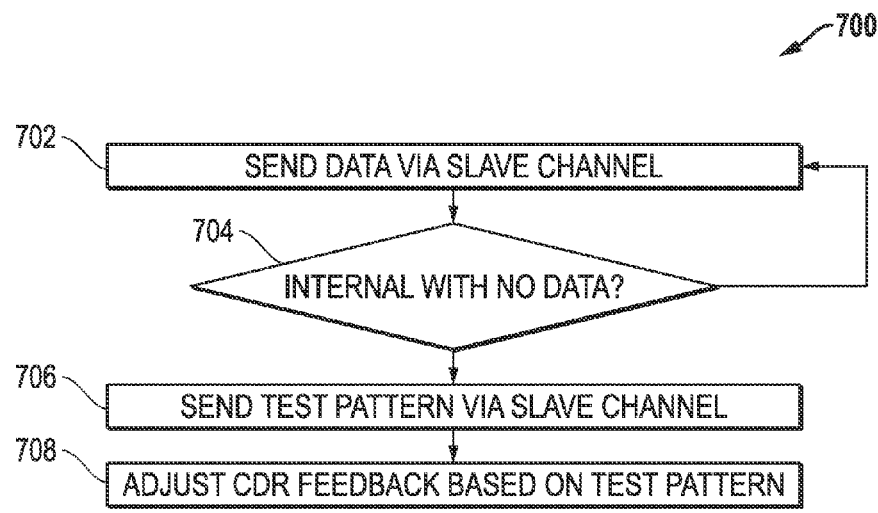
FIG. 7 is flow diagram illustrating a method of providing a test pattern to a slave channel to assist in clock and data recovery for a memory subsystem in accordance with some embodiments.

FIG. 7 illustrates flow diagram of a method 700 of providing a test pattern to a slave channel to assist in clock and data recovery for a memory subsystem in accordance with some embodiments. For purposes of illustration, the method 700 is described with respect to an example implementation at the memory controller 102 and memory module 104 of FIG. 2. At block 702 the memory module 104 sends data to the memory controller 102 via the slave channel 216. At block 704, the memory controller 102 determines if there will be a sufficient interval before another load access is sent to the memory module 104, such that there is sufficient time to receive a complete test pattern from the memory module 104. If not, the method flow returns to block 702. If there is sufficient time to receive the test pattern, the method flow moves to block 706 and the memory controller 102 requests, and the memory module 104 sends, a test pattern via the slave channel 216. At block 706, the slave channel 216 uses the edges in the test pattern to assist in phase aligning the capture clock signal provided to the decision device 229 with the clock signal MCLK, thereby assisting in accurate capture of received data.

In some embodiments, the devices and techniques described above are implemented in a system comprising one or more integrated circuit (IC) devices (also referred to as integrated circuit packages or microchips. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 8:
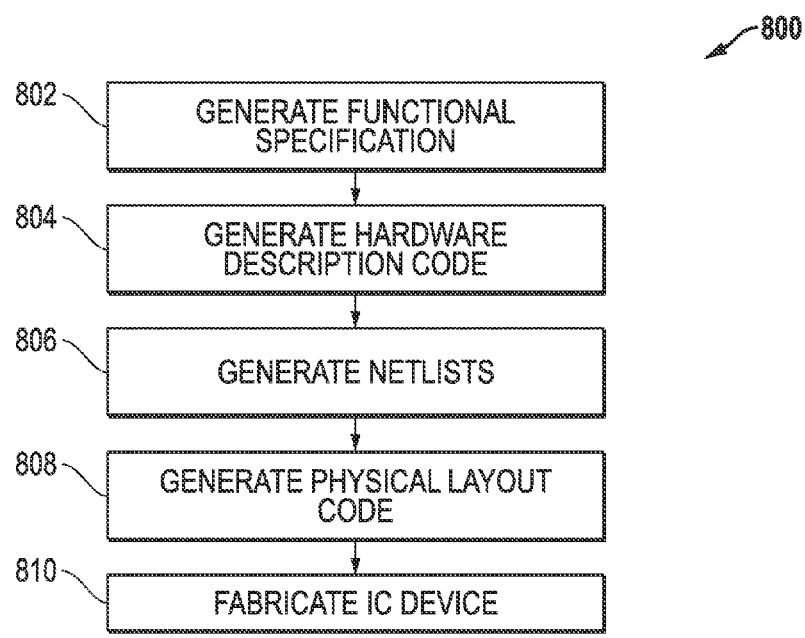
FIG. 8 is a flow diagram illustrating a method for designing and fabricating an integrated circuit device implementing at least a portion of a component of a processing system in accordance with some embodiments.

FIG. 8 is a flow diagram illustrating an example method 800 for the design and fabrication of an IC device implementing one or more aspects in accordance with some embodiments. As noted above, the code generated for each of the following processes is stored or otherwise embodied in computer readable storage media for access and use by the corresponding design tool or fabrication tool.

At block 802 a functional specification for the IC device is generated. The functional specification (often referred to as a micro architecture specification (MAS)) may be represented by any of a variety of programming languages or modeling languages, including C, C++, SystemC, Simulink, or MATLAB.

At block 804, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 806 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 808, one or more EDA tools use the netlists produced at block 806 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 810, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions stored on a computer readable medium that, when executed by the one or more processors, manipulate the one or more processors to perform one or more aspects of the techniques described above. The software is stored or otherwise tangibly embodied on a computer readable storage medium accessible to the processing system, and can include the instructions and certain data utilized during the execution of the instructions to perform the corresponding aspects.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
adjusting timing of data capture at a first slave channel of a multi-link input/output interface based on feed-forward signaling fed from a master channel of the multi-link input/output interface, the feed-forward signaling based on a predicted noise profile for the multi-link input/output interface; and
adjusting the timing of the data capture based on feedback signaling from the first slave channel, the feedback signaling indicating a phase difference between data received at the first slave channel and a reference signal.

2. The method of claim 1, further comprising:
feeding the feed-forward signal from the master channel via a filter having a set of coefficients based on the predicted noise profile.

3. The method of claim 2, wherein the signal received from the master channel is indicative of a phase difference between data received at the master channel and a capture clock signal used to capture data from the master channel.

4. The method of claim 2, further comprising:
adjusting the set of coefficients based on a comparison of data captured at the slave channel and expected data.

5. The method of claim 1, further comprising:
subsequently adjusting the feedback signaling based on a defined training pattern received via the first slave channel.

6. The method of claim 5, further comprising:
initiating reception of the training pattern in response to identifying that data is not to be communicated via the first slave channel for a threshold amount of time.

7. A processor, comprising:
a first clock and data recovery (CDR) module to generate a first capture clock signal for a first decision device of a master channel of the processor and to provide a feed-forward signal based on an output of the first decision device; and
a second CDR module to generate a second capture clock signal for a second decision device of a slave channel of the processor and to generate the second capture clock signal based on the feed-forward signal and on an output of the second decision device.

8. The processor of claim 7, further comprising:
a filter between the first CDR module and the second CDR module to filter the feed-forward signal; and
wherein the second CDR module is to generate the second capture clock signal based on an output of the filter.

9. The processor of claim 8, wherein the filter filters the feed-forward signal based on a set of coefficients that reflect a predicted noise profile for the processor.

10. The processor of claim 9, further comprising an adjustment module to adjust the set of coefficients based on a comparison of data captured at the first decision device with a defined test pattern.

11. The processor of claim 8, wherein the second CDR module is to generate the second capture clock signal based on a sum of the output of the second decision device and the output of the filter.

12. The processor of claim 11 wherein the second CDR module comprises:
a phase counter; and
wherein the second CDR module is to generate the second capture clock signal based on a value stored at the phase counter and is to adjust the value at the phase counter based on the sum of the output of the second decision device and the output of the filter.

13. The processor of claim 7, wherein:
the second CDR module is to adjust the second capture clock signal based on a test pattern generated in response to the processor identifying an interval where data is not to be received via the slave channel.

14. A processing system comprising:
a memory controller including:
a first feedback arrangement to phase align data received via a master channel with a first capture clock signal;
a second feedback arrangement to phase align data received via a slave channel with a second capture clock signal; and
a capture and data recovery (CDR) module to generate the second capture clock signal based on a feed-forward signal from the first feedback arrangement and based on a feedback signal from the second feedback arrangement.

15. The processing system of claim 14, wherein the memory controller further comprises:
a filter between the first feedback arrangement and the second feedback arrangement; and
wherein the CDR module is to generate the second capture clock signal based on an output of the filter.

16. The processing system of claim 15, wherein the filter filters the feed-forward signal based on a set of coefficients that reflect a predicted noise profile for the memory controller.

17. The processing system of claim 16, further comprising:
an adjustment module to adjust the set of coefficients based on a comparison of data captured at the master channel with expected data.

18. The processing system of claim 15, wherein the CDR module is to generate the second capture clock signal based on a sum of an output of the slave channel and the output of the filter.

19. The processing system of claim 15, further comprising:
a memory coupled to the memory controller to provide data via the slave channel.

20. The processing system of claim 19, further comprising:
a bus between the memory and the memory controller to communicate the data for the slave channel.

* * * * *